(12) United States Patent
Hong

(10) Patent No.: US 7,800,107 B2
(45) Date of Patent: Sep. 21, 2010

(54) TEST MODULE FOR SEMICONDUCTOR DEVICE

(75) Inventor: Ji-Ho Hong, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 206 days.

(21) Appl. No.: 11/829,544

(22) Filed: Jul. 27, 2007

(65) Prior Publication Data

US 2008/0023701 A1  Jan. 31, 2008

(30) Foreign Application Priority Data

Jul. 31, 2006  (KR) .................. 10-2006-0072035

(51) Int. Cl.
*H01L 23/58* (2006.01)
(52) U.S. Cl. .................. 257/48; 257/E29.02
(58) Field of Classification Search .................. 257/48, 257/E29.02, E23.179; 438/10, 11, 17, 18; 324/551, 763, 765
See application file for complete search history.

(56) References Cited

U.S. PATENT DOCUMENTS 6,649,472 B1 * 11/2003 Hsieh .................. 438/257
2004/0212016 A1 * 10/2004 Yasui et al. .................. 257/365
2007/0212800 A1 * 9/2007 Wu et al. .................. 438/14

FOREIGN PATENT DOCUMENTS

JP          57113303 A  *  7/1982  .................. 324/671

* cited by examiner

*Primary Examiner*—Minh-Loan T Tran
*Assistant Examiner*—Vongsavanh Sengdara
(74) *Attorney, Agent, or Firm*—Sherr & Vaughn, PLLC

(57) ABSTRACT

A test module for measuring electrical characteristics of a semiconductor device includes a plurality of shallow trench isolation (STI) layers formed over a semiconductor substrate. An active area includes not only an extended part enclosing the STI layers but also a plurality of minute line-width parts isolated by the STI layers. A gate oxide layer is formed over the STI layers and the active area. A gate electrode is formed over the STI layers and the minute line-width parts of the active area with interposing the gate oxide layer. An interlayer insulating layer, a metal wiring layer, a contact plug, and test pads allow non-destructive testing of the semiconductor device.

8 Claims, 5 Drawing Sheets

TEST MODULE FOR SEMICONDUCTOR DEVICE

The present application claims priority under 35 U.S.C. 119 to Korean Patent Application No. 10-2006-0072035, filed on Jul. 31, 2006 which is hereby incorporated by reference in its entirety.

BACKGROUND

Generally, a flash memory is an Electrically Erasable Programmable Read Only Memory (EEPROM) capable of electrically overwriting data. Data or information stored in the flash memory is considered non-volatile, because it is not lost when the power is turned off, unlike dynamic RAM (DRAM) or static RAM (SRAM).

The flash memory element may maintain written data for a long period. Flash memory may require a high degree of component integration to remain competitive with other memory devices. In order to manufacture a flash memory with a smaller feature size, a technique for applying a threshold line-width of less than 90 nm to a manufacturing process of the flash memory (hereinafter referred to as 90 nm-grade technique) may be used.

A 90 nm-grade technique may be applied to the manufacturing process of the flash memory to implement large scale integration and higher precision flash memory. Demand for a fabrication technique capable of correctly pre-recognizing a relatively small change in the fabrication process is rapidly increasing. When a 90 nm-grade technique is applied to the fabrication of flash memory, defects caused by the trench isolation step height induced (TRISI) effect may occur in the shallow trench isolation (STI) area for defining an active area of a semiconductor substrate.

Figure 1:
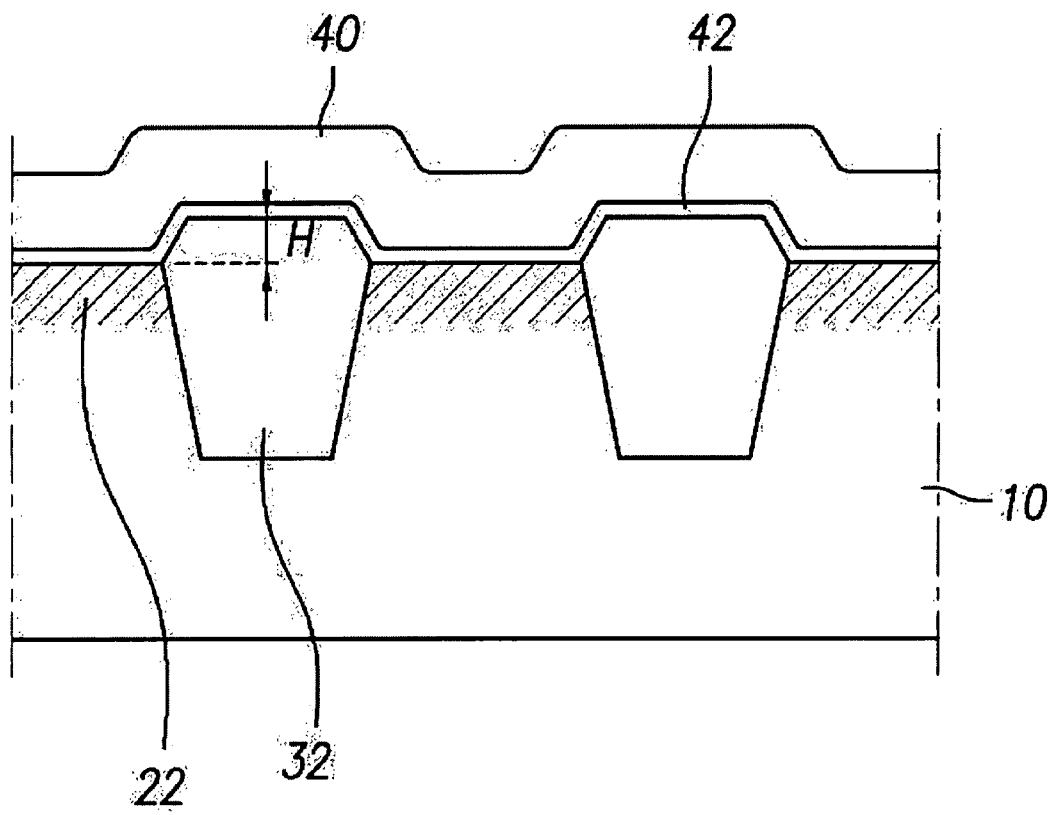

Due to a topology of the STI layer formed over a substrate in a narrow active area, a thickness of a polysilicon layer used as a gate may not be evenly maintained or managed. Variations in a threshold voltage of the memory cell may cause undesirable results. Referring to FIG. 1, a plurality of STI layers 32 for defining the active area 22 are formed over the semiconductor substrate 10. To implement a 90-nm grade technique, the interval (i.e., the active area 22) between the STI layers 32 is narrowed. The STI layers 32 are slightly projected over the substrate 10, such that the profile of the polysilicon layer 40 formed by interposing the gate oxide layer 42 between the polysilicon layer 40 and the substrate 10 is uneven. As a result, variation in a threshold voltage of the memory cell may become large, and the TRISI effect deteriorates characteristics of the products.

To resolve issues associated with the TRISI effect, the step height of the STI layer 32 may be maintained under about 70 nm. It may be difficult to measure or inspect the step height (H) of the STI layer during the manufacturing process of the semiconductor device.

The unevenness of the STI step-height may increase a current leakage between the active layer and the STI layer. If current leakage occurs between the active layer and the STI layer, data loss or corruption may occur. Therefore, a method for effectively monitoring the unevenness of the STI step-height may help improve the overall manufacture of flash memory.

SUMMARY

Embodiments relate to a test module for a semiconductor device, and more particularly to a test module for a semiconductor to measure a variation in a step height of a shallow trench isolation (STI) layer. Embodiments relate to a test module for effectively monitoring a variation of a STI step-height which may help to moderate occurrence of defective elements caused by the TRISI effect. Embodiments relate to a test module for non-destructively measuring electrical characteristics of a semiconductor device.

A test module for measuring electrical characteristics of a semiconductor device may include a plurality of shallow trench isolation (STI) layers formed over a semiconductor substrate and spaced apart from each other. The module may also include an active area including an extended part enclosing the STI layers and a plurality of minute line-width parts isolated by the STI layers. A gate oxide layer may be formed over the STI layers and the active area. A gate electrode may be formed over the STI layers and the minute line-width parts of the active area and over the gate oxide layer. An interlayer insulating layer may be formed over the substrate to cover the gate electrode. A metal wiring layer may be formed over the interlayer insulating layer and along the extended part of the active area. A contact plug may be electrically connected to the metal wiring layer and the extended part of the active area via the interlayer insulating layer. A first pad may be electrically connected to the gate electrode, and a second pad electrically may be connected to the metal wiring layer.

The semiconductor chip may include the test module. The test module is formed over a specific area of the semiconductor chip while being electrically isolated from the semiconductor device. It may be formed to allow the first and second pads to be projected over the semiconductor chip.

The test module may be formed by a manufacturing process of a semiconductor device such as a flash memory cell. However, it should be noted that the test module may be electrically isolated from semiconductor devices.

DRAWINGS

Example FIG. 1 is a cross-sectional view illustrating a general semiconductor device for explaining a TRISI effect based on a step-height variation of a shallow trench isolation (STI).

Figure 2:
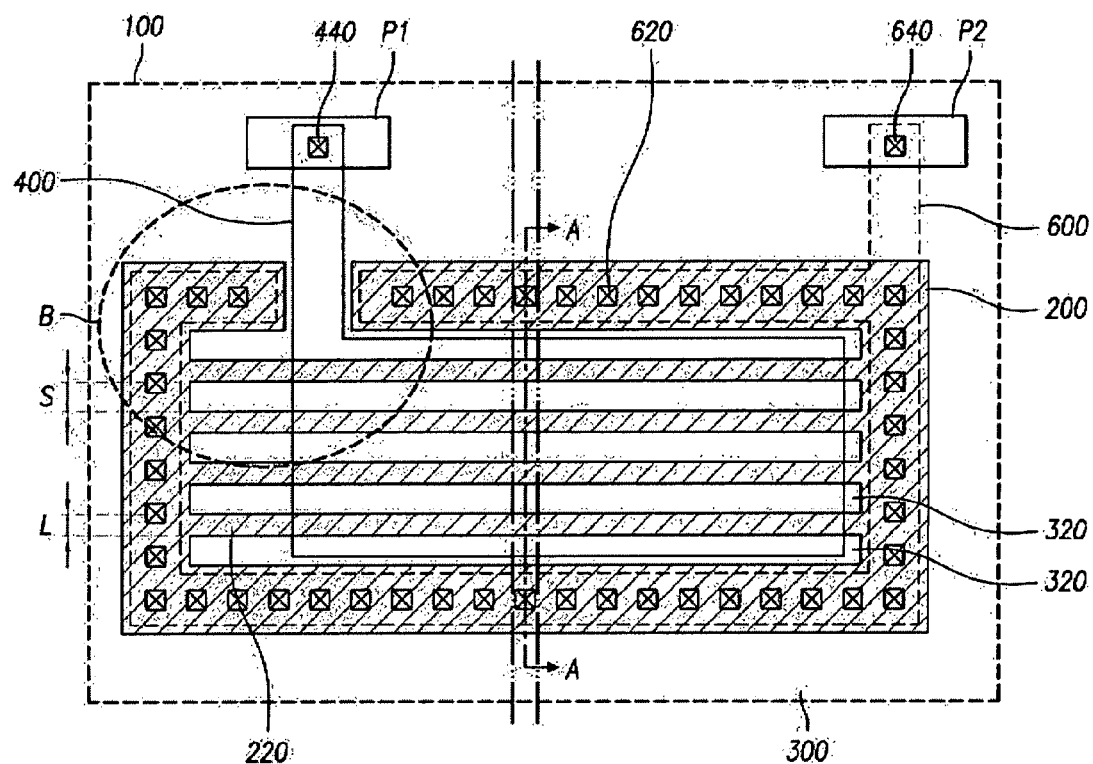

Example FIG. 2 shows a layout of a test module of a semiconductor device, according to embodiments.

Figure 3:
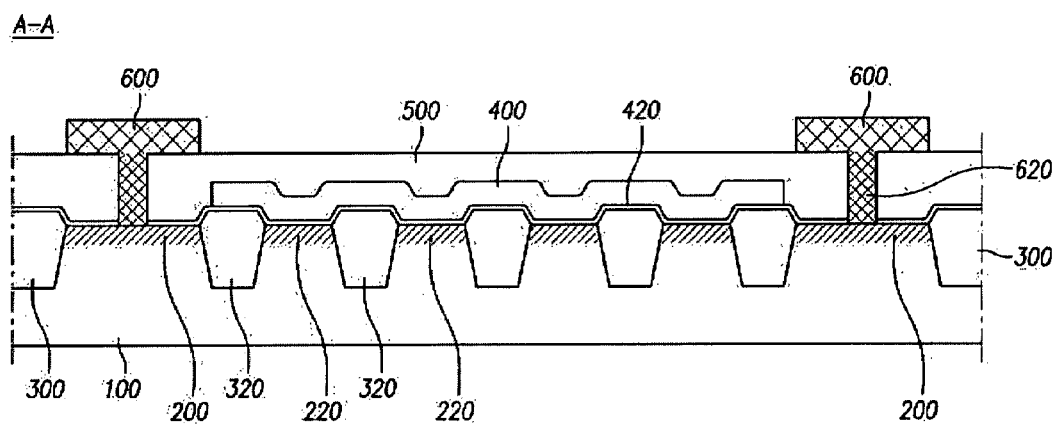

Example FIG. 3 is a cross-sectional view illustrating a test module taken along the line A-A line of Example FIG. 2, according to embodiments.

Figure 4:
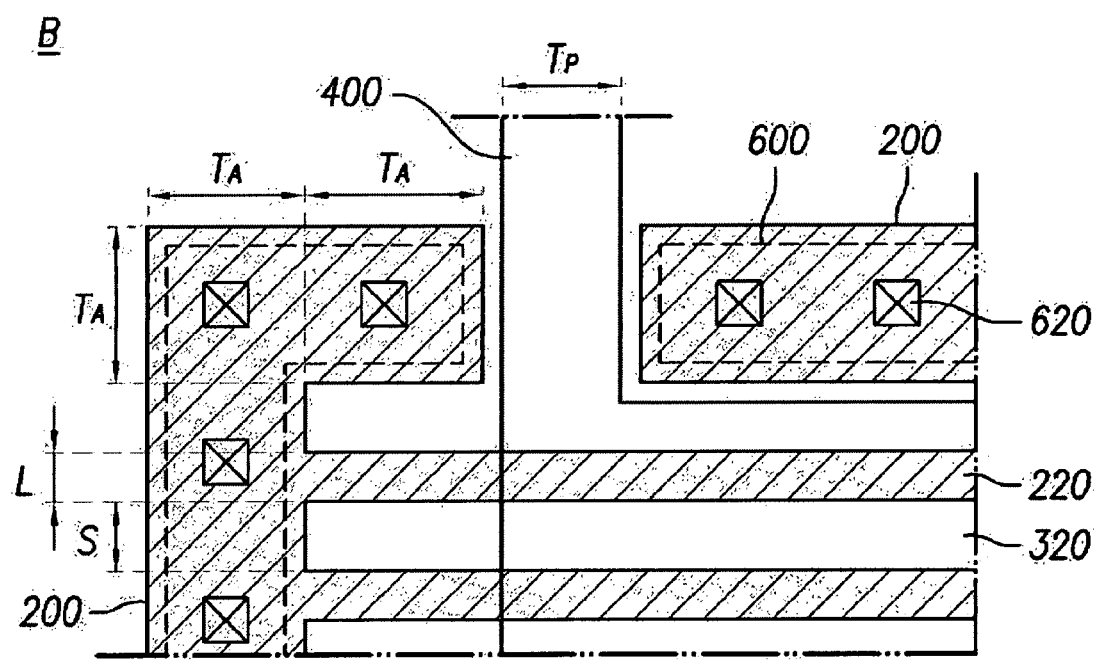

Example FIG. 4 is a partially-enlarged view illustrating the B area of Example FIG. 2, according to embodiments.

Figure 5:
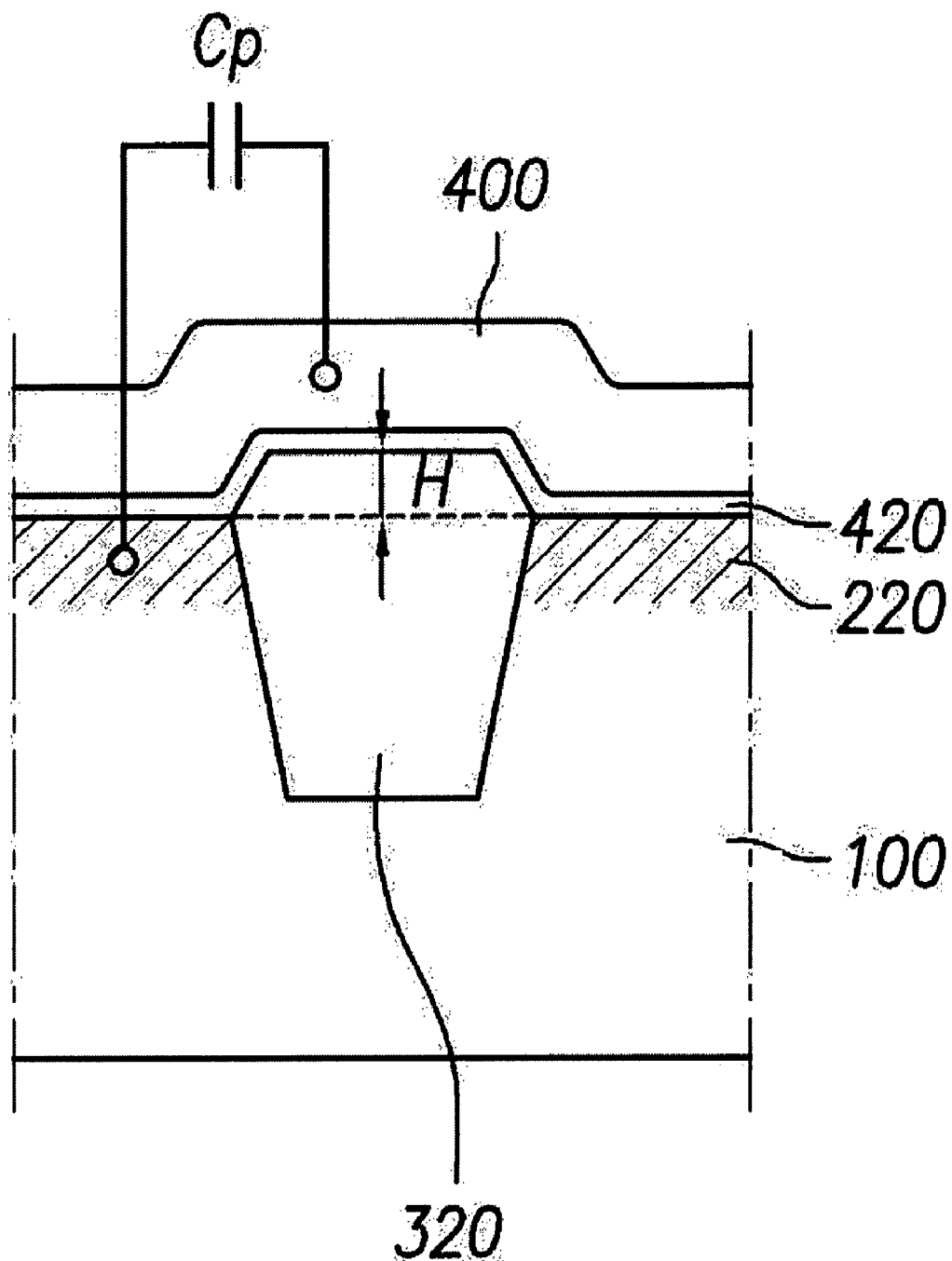

Example FIG. 5 is a conceptual diagram illustrating the operation principles of a test module of the semiconductor device, according to embodiments.

DESCRIPTION

Referring to FIG. 2, the area 100 (hereinafter referred to as a test-module formation area 100), in which a test module is to be formed in a silicon semiconductor substrate, may be formed separately from a main circuit area including semiconductor devices such as flash memory cells. An STI layer may be formed in the substrate of the test-module formation area 100, such that it defines the active area. The STI layer may be formed during the STI process for defining the active area of the semiconductor device of the main circuit area.

Referring to FIGS. 2 and 3, a plurality of STI layers 320, each of which has a predetermined width, may be spaced apart from each other, and may be formed in parallel in the test-module formation area 100. The active area 220 (also called a minute line-width part) having a minute line width may be defined by several STI layers 320, and the minute line-width part 220 and the STI layer 320 may be alternately repeated. The STI layers 320 and the minute line-width parts 220 may be enclosed by a wider extended active area (also called the extended part) 200, and the extended part 200 may in turn be enclosed by the STI layer 300. STI layers 300 and 320 may be formed by a general STI process.

Predetermined impurities may be implanted in the active area (i.e., the extended part 200 and the minute line-width part 220) of the test module formation area 100, such that a diffusion area is formed. A gate oxide layer 420 may be formed over the entire substrate of the test module formation area 100, and a polysilicon layer 400 may be formed over the gate oxide layer 420. The polysilicon layer 400 may be used as a gate electrode, and may overlap the minute line-width part 220 and the STI 320.

After a polysilicon layer 400 is formed, an interlayer insulating layer 500 may be formed over the entire test-module formation area 100. A plurality of contact holes may be formed along the extended active area 200 using a general contact plug forming process, and a conductive material may be buried in the contact holes, such that a contact plug 620 is formed. A contact plug 440 for electrically connecting the polysilicon layer 400 to the first pad (P1) may be formed in the interlayer insulating layer 500.

A metal wiring layer 600 may be formed over the interlayer insulating layer 500. The metal wiring layer 600 may be formed by a related semiconductor device manufacturing process. A plurality of metal wiring layers 600 may be formed to have the same shapes overlapped with the extended active area 200, and may be electrically connected to the extended active area 200 by the contact plug 620.

The interlayer insulating layer may be formed to insulate the metal wiring layer 600. A first pad P1 and a second pad P2 may be formed over the unit semiconductor chip. The first pad P1 may be electrically connected to the polysilicon layer 400 by the contact plug 440, and the second pad P2 may be electrically connected to the metal wiring layer 600 by the contact plug 640.

Individual constituent elements of the test module (i.e., active areas 200 and 220, STI layers 300 and 320, gate oxide layer 420, polysilicon layer 400, interlayer insulating layer 500, metal wiring layer 600, and contact plugs 620, 440, and 640) may be formed by manufacturing process used for main circuit areas.

Referring to FIG. 4, the test module according to embodiments is designed to effectively monitor the variation in STI step-height associated with the TRISI phenomenon when the flash memory is formed by the 90 nm minute line-width technique. A minute line-width active area 220 and the STI layer 320 may be formed under the same conditions as those of the main circuit area. For example, if a minimum line width of the flash memory of the main circuit area is 90 nm, the line width L of the minute line-width active area 220 and the line width S of the STI layer 320 may be set to 90 nm, respectively. To allow the minute line-width active area 220 and the STI layer 320 to behave similarly to those of the main circuit area, the line width L of the active area 220 and the line width S of the STI layer 320 may be repeated three or more times.

The line width (TA) of the extended active area 200 may be set to 1 μm or more to stably detect electrical characteristics. The line width of the polysilicon layer 400 extended to the outside of the active area 200 may also set to 1 μm or more to stably detect electrical characteristics.

With reference to FIG. 5, an STI layer and a predetermined transistor structure may be formed in the main circuit area, and a test module may be formed in an independent area with substantially the same conditions. With the development of highly integrated semiconductor devices, a TRISI effect may occur due to variations in the STI step-height. The prior art lacks any teaching for non-destructively detecting the variation of the STI step-height in a pre-formed semiconductor device. By using the test module according to embodiments, the STI step-height variation of semiconductor devices having a minimum line width can be non-destructively monitored.

In other words, after manufacturing a predetermined semiconductor device and a predetermined test module, a variation in electrostatic capacity between the first pad P1 and the second pad P2 may be measured. The first pad P1 may be connected to the polysilicon layer 400, and the second pad may be connected to the extended active area 200 via the metal wiring layer 600. The extended active area 200 is formed with being connected to the minute line-width part 220, such that the electrostatic capacity between the first pad P1 and the second pad P2 indicates electrostatic capacity Cp between the active area 220 and the polysilicon layer 400, as illustrated in FIG. 5. If the height (H) of the STI layer 320 projected over the substrate is higher than a reference value (e.g., 70 nm), the polysilicon layer 400 becomes larger, and the electrostatic capacity Cp increases. Therefore, the STI step height can be easily measured by measuring the electrostatic capacity Cp.

As apparent from the above description, embodiments can effectively determine the STI step height using a non-destructive method in a semiconductor device such as a flash memory. Embodiments may help effectively manage the fabrication process of semiconductor devices resulting in increased production yields.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a semiconductor substrate;
a plurality of first shallow trench isolation layers formed in a semiconductor substrate and defining a first active area, wherein the first active area includes a plurality of first active area portions formed between adjacent first shallow trench isolation layers;
a plurality of second shallow trench isolation layers formed in the semiconductor substrate and defining a second active area which encloses the first active area;
a gate electrode formed on the first active area;
an interlayer insulating layer formed over and contacting the gate electrode;
a plurality of first contact plugs formed on the second active area and extending through the interlayer insulating layer;
a plurality of second contact plugs formed on the second active area and distal from the plurality of first contact plugs;
a metal wiring layer electrically connected to the second active area via one of the plurality of first contact plugs;
a first pad electrically connected to the gate electrode via one of the plurality of second contact plugs; and
a second pad electrically connected to the metal wiring layer via another one of the plurality of second contact plugs.

2. The apparatus of claim 1, wherein said apparatus is a test module for measuring electrical characteristics of a semiconductor device.

3. The apparatus of claim 1, wherein the first shallow trench isolation layers are arranged parallel to each other.

4. The apparatus of claim 1, wherein both ends of the active area are formed in series with the extended active area.

5. The apparatus of claim 1, wherein predetermined impurities are implanted in the first active area and the second active area.

6. The apparatus of claim 1, wherein a variation in electrostatic capacity between the first pad and the second pad is measured, such that a step height of the first and second isolation layers is measured.

7. The apparatus of claim 1, wherein said metal wiring layer is formed over the interlayer insulating layer in the second active area.

8. An apparatus comprising:
   a semiconductor substrate;
   a plurality of first isolation layers protruding from the semiconductor substrate defining a first active area including a plurality of first active area portions formed between adjacent first isolation layers;
   a plurality of second isolation layers protruding from the semiconductor substrate defining a second active area enclosing the first active area, the second active area having a width greater than the width of the first active area portions;
   a first insulating layer formed over the first active area and the second active area and contacting the semiconductor substrate and each one of the first isolation layers and the second isolation layers;
   a polysilicon layer formed on the first active area over and contacting a portion of the first insulating layer that overlaps the first shallow trench isolation layers;
   a second insulating layer formed over the first active area and the second active area and contacting the polysilicon layer and the first insulating layer;
   a plurality of first contact plugs formed on the second active area and extending through the insulating layer and contacting the semiconductor substrate;
   a plurality of second contact plugs formed on the second active area and distal from the plurality of first contact plugs;
   a metal wiring layer electrically connected to the second active area via one of the plurality of first contact plugs;
   a first pad electrically connected to the polysilicon layer via one of the plurality of second contact plugs; and
   a second pad electrically connected to the metal wiring layer via another one of the plurality of second contact plugs.

* * * * *